(12) United States Patent
Jones et al.

(10) Patent No.: US 12,348,002 B2
(45) Date of Patent: Jul. 1, 2025

(54) CURRENT LOAD-CONTROLLED LASER DRIVER

(71) Applicant: II-VI Delaware, Inc., Wilmington, DE (US)

(72) Inventors: Theron Jones, Wilmington, DE (US); Richard Davis, Wilmington, DE (US); Brian Carey, Wilmington, DE (US); Michael Yeung, Wilmington, DE (US)

(73) Assignee: II-VI DELAWARE, INC., Wilmington, DE (US)

( * ) Notice: Subject to any disclaimer, the term of this patent is extended or adjusted under 35 U.S.C. 154(b) by 621 days.

(21) Appl. No.: 17/804,792

(22) Filed: May 31, 2022

(65) Prior Publication Data

US 2023/0387657 A1    Nov. 30, 2023

(51) Int. Cl.
*H01S 5/042* (2006.01)
*H01S 5/026* (2006.01)
*H01S 5/183* (2006.01)

(52) U.S. Cl.
CPC .......... *H01S 5/0427* (2013.01); *H01S 5/0262* (2013.01); *H01S 5/183* (2013.01)

(58) Field of Classification Search
CPC ................................................. H01S 5/06812
USPC ......................................................... 372/38.02
See application file for complete search history.

(56) References Cited

U.S. PATENT DOCUMENTS 7,630,422 B1 * 12/2009 Ziazadeh .............. H01S 5/0427
                                                           372/38.1
2020/0381891 A1 * 12/2020 Shen ..................... H05B 45/345

FOREIGN PATENT DOCUMENTS

JP       H02275684 A     11/1990

* cited by examiner

*Primary Examiner* — Tuan N Nguyen
(74) *Attorney, Agent, or Firm* — Blank Rome LLP

(57) ABSTRACT

Laser circuits are disclosed herein that include, in one example, a proxy laser drive cell and a proxy comparator circuit for deriving a laser driver bias control using one or more constant current supplies. Comparator circuits are disclosed that are adapted to generate an output based on a proxy voltage having first and second voltage components wherein one of the voltage components is developed based on one or more constant current supplies indicative of laser control current.

19 Claims, 3 Drawing Sheets

CURRENT LOAD-CONTROLLED LASER DRIVER

BACKGROUND OF THE INVENTION

Semiconductor lasers are useful for any number of digitally controlled applications. Vertical cavity surface emitting lasers (VCSELs) are one type of semiconductor laser that has particular use in industrial, biomedical, and communication applications, as well as others. However, prior methods of controlling laser power are typically based on directly correlating a driver gate voltage to a laser optical output power. Such correlation must typically be obtained by extensive laser-specific calibration by the user in the application environment or through less accurate linear calibration based on two-point calibration. However, such calibration schemes do not typically provide an adequate solution across various optical powers for lasers, because semiconductor lasers, including VCSELs, exhibit non-linear voltage to power behavior, which makes voltage-to-laser-power control difficult to achieve with good accuracy.

BRIEF SUMMARY OF THE INVENTION

Disclosed herein are laser circuits having a supply power bus adapted to provide a supply voltage, a first constant current supply, a second constant current supply, and at least one laser drive cell in the current path of a laser having a driver bias control transistor adapted to regulate a laser current through the laser drive cell, at least one proxy laser drive cell having a proxy driver control transistor adapted to regulate a proxy drive current through the proxy laser drive cell, and proxy comparator circuit having a first input, a second input, and an output, where the proxy comparator circuit is adapted to generate the output based on the difference between the first input and the second input, and the first and second constant current supplies establish a proxy voltage at the first input of the proxy comparator circuit. In one aspect of the disclosure, the output of the proxy comparator circuit is electrically interfaced with the proxy laser drive cell such that the output of the proxy comparator circuit varies a current through proxy laser drive cell, and a proxy gate control signal for the proxy laser drive cell is electrically interfaced to the driver bias control transistor. In another aspect of the disclosure, the laser drive cell has a laser drive cell drain voltage, the proxy drive cell has a proxy laser drive cell drain voltage, and a comparator circuit is adapted to servo the proxy drive cell drain voltage to match the laser drive cell drain voltage. In yet another aspect of the disclosure, the laser is a vertical cavity surface emitting laser (VCSEL). In another aspect of the disclosure, an output of a proxy comparator circuit is electrically interfaced with a proxy laser drive cell through a first proxy coupling transistor and a second proxy coupling transistor, and a gate of each of the first and second coupling transistors are electrically connected to the output of the proxy comparator circuit.

Disclosed example laser circuits include a first proxy coupling transistor having a drain terminal electrically connected to a current mirror and an output of the current mirror is electrically connected to a gate of a proxy driver control transistor to provide a proxy gate control signal. In one aspect of the disclosure, a proxy gate control signal is electrically interfaced to a driver bias control transistor through a voltage to current controller. In another aspect of the disclosure a second proxy coupling transistor has a drain terminal electrically connected to a drain of the proxy driver control transistor and to a second input of the proxy comparator circuit. In yet another aspect of the disclosure a first input of the proxy comparator circuit is adapted to receive a proxy voltage having a first voltage component about equal to a laser threshold voltage of a laser and a second voltage component proportional to a current-based voltage drop of the laser, where the current-based voltage drop of the laser is a function of a current through the laser. In another aspect of the disclosure, a first input of a proxy comparator circuit is electrically interfaced with the first constant current supply, the second constant current supply, and a proxy resistor, where the proxy resistor is electrically between the first input of the proxy comparator circuit and the supply power bus and first and second constant current supplies are adapted to each sink a constant current, respectfully, that establishes the proxy voltage at the first input of the proxy comparator circuit. In yet another aspect of the disclosure, the proxy voltage is indicative of a laser knee voltage of the laser summed with a current-based voltage drop of the laser, where the current-based voltage drop of the laser is a function of a current through the laser. In another aspect of the disclosure, a first input of the proxy comparator circuit is inverting and the second input of the proxy comparator circuit is non-inverting.

Disclosed herein are laser circuits with at least one proxy laser drive cell, wherein the laser circuit includes first and second constant current supplies that are digitally configurable. In another aspect of the disclosure, a laser drive cell includes a driver enable transistor in the current path of a laser and a proxy laser drive cell includes a proxy enable transistor in the current path of the proxy driver control transistor. In another example aspect of the disclosure the second constant current supply is adapted to supply a constant current electrically interfaced to an output of a current mirror and a gate of a proxy driver control transistor. In one aspect of the disclosure, a proxy comparator circuit comprises an operational amplifier. In another aspect of the disclosure, a scaling amplifier is electrically between a second constant current supply and a proxy comparator circuit. In yet another aspect of the disclosure, a laser circuit includes a plurality of laser drive cells, each in the current path of the laser and/or a plurality of proxy laser drive cells. In another aspect of the disclosure, a laser circuit includes a plurality of second proxy coupling transistors, and each second proxy coupling transistors is respectively electrically coupled to the proxy driver control transistor within each proxy laser drive cell.

DETAILED DESCRIPTION OF THE INVENTION

Figure 1:
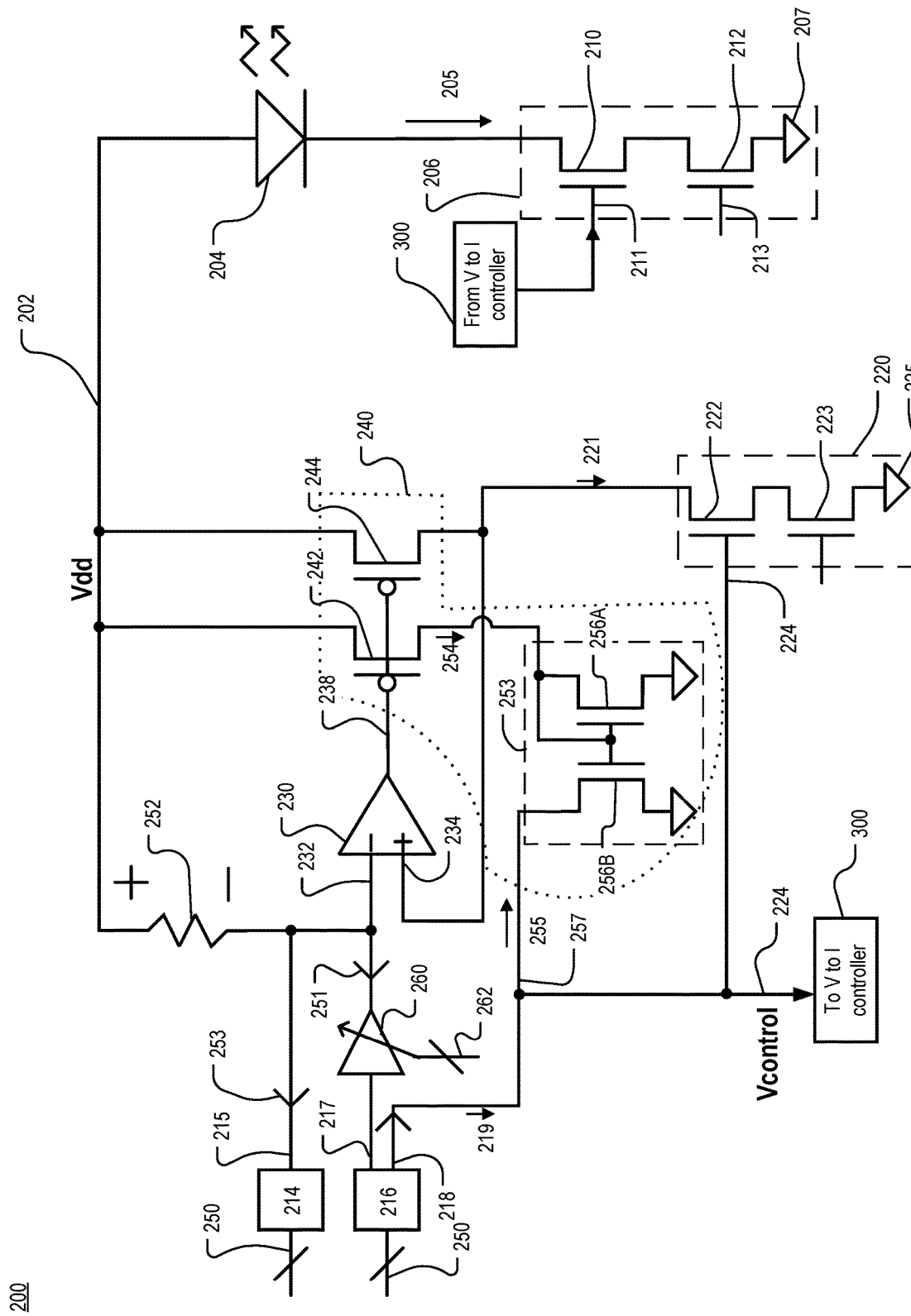
FIG. 1 is an electrical schematic of a laser circuit in accordance with disclosed embodiments.

Laser optical power, which will be referred to herein as laser power, is a function of the current flowing through laser. It should be noted that while the remainder this specification will be discussed in terms of a VCSEL, it is equally applicable to other lasers. Conventional driver design is based on controlling the gate voltage on a metaloxide-semiconductor field-effect transistor (MOSFET) conducting current to a VCSEL, where that gate voltage is correlated to optical power independent of VCSEL load voltage. However, because laser control MOSFETS must pass a relatively high amount of current, as the drain voltage changes it modifies the channel length within the MOSFET, which is known as channel length modulation. Channel length modulation creates a variability in the drain current of the MOSFET with respect to drain-source voltage ($V_{DS}$). As such, local variations in $V_{DS}$ of the driver MOSFET can result in variations and inaccuracies of optical power with respect to voltage control of the laser. This may be particularly prevalent in a multi VCSEL array in which there are variations between local ground. Such inaccuracies can result in accuracies of the optical output of the laser of less than about 80%, even after calibration. As disclosed herein, controlling the VCSEL driver control voltage based on the varying VCSEL current/forward voltage characteristics and supply voltages results in more accurate optical power control than controlling the VCSEL driver control voltage based on laser calibration or other current approximation techniques alone.

Disclosed herein are improved laser circuits and drivers that target and control the actual metric of concern—optical power by deriving the gate voltage for a desired operating current in a control circuit and reproducing that gate voltage relative to the local ground at the actual VCSEL compensating for current driven variations. By allowing the user to select the desired current, which can be more easily derived from the desired optical power, the driver can more accurately and easily drive the laser to extract the desired optical power.

The control current disclosed in example embodiments is derived through the use of a replica, or proxy, laser circuit that simulates the appropriate knee voltage and the voltage current-resistance (I-R) drop characteristics of the actual in-circuit VCSEL (and accompanying driver circuit) so that the current through the laser can be precisely controlled. The driver bias voltage of the actual laser drive cell in the current path of the laser, for example a driver FET(s), is controlled by a proxy control circuit based on the current through the replica, or proxy, VCSEL circuit and the actual voltage across the driver circuit, which minimizes inaccuracies based on voltage variations, which would in turn minimize channel length modulation and current inaccuracies. In this manner, the driver bias voltage is not directly controlled, but derived from the desired current at the actual driver on state operating voltage. Such a solution can provide accuracies of actual optical output of greater than 98%, an improvement over the prior art.

Shown in FIG. 1 is an example laser circuit 200 that includes a semiconductor laser 204, which may be for example a VCSEL. The laser 204 is supplied power from a supply power bus 202 also labeled $V_{dd}$. Current 205 flows through VCSEL 204 to the local laser ground 207. Once the voltage across the VCSEL exceeds a threshold voltage (which may be also be referred to as a "knee" voltage or a junction voltage) then the VCSEL begins to conduct current. Once that current exceeds a threshold current, and the VCSEL is above the knee voltage and overcomes the I-R drop of the VCSEL, the VCSEL begins lasing. The forward voltage is equal to the knee voltage plus the voltage drop across the VCSEL resistance. The current 205 through the VCSEL 204 is controlled via a laser drive cell 206 in the current path of the VCSEL 204, including for example a driver bias control transistor 210, which is shown as an n-channel metal-oxide-semiconductor field-effect transistor (MOSFET). The bias control transistor 210 may be operated in the saturation region of the MOSFET. As will be discussed below, the bias control transistor may in certain configurations be operated in the triode region. In the saturation region, the drain current, i.e., current 205, will vary based on the gate voltage of the bias control transistor, which allows for current 205 control of the laser 204. But, the drain current 205 will also vary with respect to the $V_{DS}$ of the driver bias control transistor, for example due to the channel length modulation effect discussed previously. The slope of such variations will also change in varying conditions of the laser 204. As such, the disclosed laser circuit 200 will utilize a proxy circuit to determine a control signal based on a proxy drain voltage and reduce the error associated with such variations. While FIG. 1 will make use of n and p channel MOSFETs for demonstration purposes, it should be understood that other types of transistors or field effect transistors (FETs) may also be used depending on the configuration, e.g., positive or negative side control. Similarly, the disclosure is not limited to n or p channel transistors where they are depicted. While an n-channel MOSFET is shown for negative-side control of the VCSEL 204, p-channel MOSFETS may also be used for positive-side control in an alternative configuration. The same is true for other n and p channel MOSFETS disclosed herein.

The driver bias control transistor 210 may be adapted to be driven by a driver bias gate control signal 211. Optionally, the laser drive cell 206 may include a second transistor, e.g., driver enable transistor 212, in the current path of the laser 204 which can function as an "on" "off" enable transistor or for time cycling or modulation of the laser 204. In such a configuration, the driver enable transistor 212 may be adapted to digitally time cycle the laser 204 via a driver enable gate control signal 213, while the driver bias control transistor 210, via driver bias gate control signal 211, controls the current 205, and thus optical power output, of the laser 204.

The driver bias gate control signal 211 is derived through the use of a proxy laser drive cell 220 that is designed to proportionally represent or match the voltage drop of the actual laser 204 and its associate laser drive cell 206. The proxy laser drive cell 220 may include a proxy driver control transistor 222 adapted to regulate a proxy drive current 221 through the proxy laser drive cell 220. The proxy driver control transistor 222 is depicted as an n-channel MOSFET. Because the proxy laser drive cell 220 is designed to proportionally represent the laser drive cell 206, proxy driver control transistor 222 may be chosen to be similar in configuration as the driver bias control transistor 210, although it may be of a different proportional scale of the proxy laser drive cell 220.

The proxy driver control transistor 222 should be selected to have similar current control and channel length modulation effects as driver bias control transistor 210. It should be noted that proxy driver control transistor 222 may be selected to be the same transistor as driver bias control transistor 210, however, driver bias control transistor 210 must be sized sufficiently to pass the full current 205 of laser 204, so using the same transistor, while effective, would likely result in wasted power within the proxy laser drive cell 220. Accordingly, proxy driver control transistor 222 may be sized as a scale fraction of the current capabilities of driver bias control transistor 210 provided that it is large enough to have similar channel modulation effects and channel current density as driver bias control transistor 210, which can provide a balance in accurately reproducing voltage drop characteristics at a smaller power cost. This may be accomplished using MOSFETS for proxy driver control transistor 222 that have smaller channel widths than driver bias control transistor 210. Doing so provides accurate proxy characteristics as compared to driver bias control transistor 210 without using as much current as driver bias control transistor 210. For example, proxy driver control transistor 222 may be selected having a scaled current rating and/or channel width of from 1 to $\frac{1}{1,000,000}$ that of driver bias control transistor 210, in another example the scaled multiplier is from about $\frac{1}{100}$ to about $\frac{1}{10,000}$. Similar to the proxy laser drive cell 220, optionally, the proxy laser drive cell 206 may include a second transistor, e.g, proxy enable transistor 223, in the current path of the proxy driver control transistor 222 which can similarly function as an "on" "off" enable transistor or for time cycling or modulating the proxy laser drive cell 206. Proxy enable transistor 223 may be selected to have similar IR drop characteristics as driver enable transistor 212, but may be scaled as having fractional current carrying capabilities similar to proxy driver control transistor 222. Current flows through the proxy laser drive cell 220 to proxy ground 225 which need not be at the same potential as local laser ground 207.

The laser circuit 200 includes a first constant current supply 214 and a second constant current supply 216. As used herein a constant current supply may be adapted to either sink or source current depending on its configuration or function, which will be discussed below. While the first and second constant current supplies 214, 216 are schematically represented as two distinct current supplies, they need not be and may be combined into a single device or package, provided that such a configuration provides the capability of setting at least two different currents as needed to control the proxy voltage at input 232 (discussed below). In one example the first and second constant current supplies 214, 216 are current digital-to-analog converters (I-DACs), for example. Each of the first and second constant current supplies 214, 216 have, respectively, current sinking "inputs" 215, 217, respectively, and second constant current supply 216 also has a constant current supplying "output" 218. For purposes of this disclosure, if a terminal on a constant current supply is adapted to sink current it will be referred to as an "input" and a terminal adapted to supply current it will be referred to as an "output" based on their respective functions to either sink or supply current, for example first constant current supply input 215, second constant current supply first input 217, and second constant current supply output 218 are each adapted to sink current to inputs 215, 217 and to supply current to output 218.

Each of the first and second constant current supplies 214, 216 may be configurable, either through digital inputs, or other system configurations, to modify the amount of current sinking/supplying through each of first constant current supply input 215, second constant current supply input 217, and second constant current supply output 218. Such configuration is schematically represented as configuration inputs 250. Each of the first and second constant current supplies 214, 216 are configured to sink current to the first constant current supply input 215 and second constant current supply input 217 through a proxy resistance 252 to establish a proxy voltage at the input 232 of a proxy comparator circuit 230 based on the voltage drop across proxy resistance 252 with reference to the supply power bus 202. The proxy comparator circuit 230, the operation of which will be discussed below, may be implemented, for example, as a servo amplifier. Proxy resistance 252 should be chosen in conjunction with first and second constant current supplies 214, 216 such that it provides the desired proxy voltage. The proxy voltage, and thus the voltage at the input 232 of proxy comparator circuit 230 is a summation of two voltage components. First is the voltage drop component established by the current 253 sunk through proxy resistance 252 to first constant current supply input 215. The second is the voltage drop established by the current 251 sunk through proxy resistance 252 to the second constant current supply input 217. In this configuration, the first and second constant current supplies 214, 216 may be independently configured, e.g., through configuration inputs 250, such that they sink the appropriate current for the desired relative proxy voltage components. For example, the first constant current supply 214 can be configured to sink sufficient current such that the first proxy voltage component of the proxy voltage is representative of or equal to the knee voltage of the laser 204 and the second constant current supply 216 can be configured to sink the desired current 205 of the laser 204, or a proportional fraction thereof such that the second proxy voltage component of the proxy voltage is representative of or equal to the I-R drop of the laser 204. Accordingly, the proxy voltage is the summation of the first and second proxy voltages components, which together is representative of or equal to the forward voltage of the laser 204. The second constant current supply 216 output 218 may also be configured to supply the same amount of current as that sunk to second constant current supply 216 input 217 or a proportional value thereof. Optionally, a configurable scaling amplifier 260 (configurable through scaling configuration inputs 262) may be included to proportionally scale or amplify the sinking capability of second constant current supply input 217 to obtain the desired proxy voltage representative or equal to the I-R drop of the laser 204 or proportional scaling factor thereof. As will be discussed below, the proxy comparator circuit 230 will drive its output 238 to an equilibrium based on a feedback signal indicative of the proxy laser drive cell 220 current 221 to the second input 234 of the proxy comparator circuit 230.

The proxy comparator circuit 230 is electrically interfaced at 240 with the proxy laser drive cell 220. For example, interface 240 is shown having a first proxy coupling transistor, which will be referred to as proxy gate coupling transistor 242, and a second proxy coupling transistor, which will be referred to as proxy drain coupling transistor 244. Each of proxy gate coupling transistor 242 and proxy drain coupling transistor 244 are shown as p-channel MOSFETS in the present configuration, but as noted above, other configurations may also be used. The output 238 of the proxy comparator circuit 230 is electrically connected to the gates of each of proxy gate coupling transistor 242 and proxy drain coupling transistor 244. And the sources of each of proxy gate coupling transistor 242 and proxy drain coupling transistor 244 are electrically connected to supply power bus 202. The drain of proxy gate coupling transistor 242 is electrically connected to a current mirror 253 that will mirror the current mirror input current 254 to current mirror output current 255, shown configured as a current sink. While any known current mirror can be used, for example a cascode current mirror, a simple current mirror 253 is shown for explanation purposes having mirrored n-channel MOSFET transistor 256A and a mirroring n-channel MOSFET transistor 256B, in which the gates of each transistor 256A are connected and electrically connected to the drain of proxy gate coupling transistor 242. The function of the current mirror 253 is to mirror the current mirror input current 254 to the current mirror output current 255. Assuming mirrored transistor 256A and mirroring transistor 256B are equivalent transistors then current mirror input current 254 will be equal to the current mirror output current 255. However, alternatively, mirroring transistor 256B can also be a scale multiple size of mirrored transistor 256A such that current mirror input current 254 is a fraction or multiple of current mirror output current 255.

However, regardless of the current mirror 253 configuration, at equilibrium, current mirror output current 255 (or current sinking input) will be equal to second constant current supply output current 219 supplied by second constant current supply output 218. The output 257 of the current mirror 253 is electrically connected to the proxy driver control transistor 222 and the second constant current supply output 218 to provide the proxy gate control signal 224. Further, the drain of proxy drain coupling transistor 244 is electrically connected to the drain of proxy driver control transistor 222 and the proxy comparator circuit 230 second input 234.

While proxy drain coupling transistor 244 is sized to pass proxy drive current 221, the proxy gate coupling transistor 242 may be sized as a scale fraction of proxy drain coupling transistor 244 to reduce power consumption of the laser circuit 200. In such instances, the current mirror 253 may be scaled as needed using different sized transistors 256A, 256B to match current 219.

Proxy comparator circuit 238 may include an operational amplifier (OPAMP) configured as a servo amplifier and additional configuration circuitry, however, additional inputs to proxy comparator circuit 230, for example positive and negative supply voltages are omitted for clarity. As shown, proxy comparator circuit 230 first input 232 is an inverting input and proxy comparator circuit 230 second input 234 is a non-inverting input. Proxy comparator circuit 230 is configured as a servo circuit to compare its first and second inputs 232, 234 and drive that difference toward zero.

At equilibrium, the first constant current supply 214 may be configured to sink sufficient current 253 through the proxy resistance 252 to match the knee voltage of the laser 204, and the second constant current supply 216 may be configured to sink at 217 (and supplying at 218) a current proportional to the desired current 205 such that the voltage drop through proxy resistance 252 from current 251 matches the IR drop of the laser 204. Accordingly, the gate voltage of 222 (proxy gate control signal 224) is the derived control reference for the laser driver cell 206, which is also referred to on FIG. 1 as $V_{control}$, and will be utilized to generate the driver bias gate control signal 211 (the potential from 211 to local laser ground 207), which will be indicative of the current at 219 for the appropriate drain voltage of the proxy drive cell 220 to match the drain voltage of the laser drive cell 206 according to the load voltage (the forward voltage) of the laser 204. That is, the proxy drive cell 220 will operate in the same drain voltage conditions as the laser drive cell 206 for the desired current so the proxy gate control signal 224 will be derived accordingly.

As an example, if more laser 204 current 205 is desired, the second constant current supply 216 configuration inputs 250 may be adjusted to sink more current through second constant current supply input 217 (and supply more current 219 at second constant current supply output 218), more current 251 will be drawn through proxy resistance 252, causing the proxy voltage at proxy comparator circuit first input 232 to decrease due to the increased voltage drop across proxy resistance 252. Because the resulting proxy voltage at proxy comparator circuit first input 232 is an inverting input, then this initially results in the proxy comparator circuit output 238 increasing. This increase results in an initial decrease of the source to gate voltage of both proxy gate coupling transistor 242 and proxy drain coupling transistor 244, which will cause the current mirror input current 254 and proxy drive current 221, initially, to decrease. The decrease in current mirror input current 254 will initially result in a decrease in current mirror output current 255. The difference between the increased supply current 219 and the decreased current mirror output current 255 causes the proxy gate control signal 224 to increase, which causes current 221 to increase.

As current 221 increases, the proxy comparator circuit second input 234 voltage decreases, which will in turn cause the proxy comparator circuit output 238 to decrease, thus increasing current 254 and current mirror output 255. This cycle will continue until current mirror output 255 is equal to supply current 219. After further settling, comparator circuit 230 will ultimately servo the difference between the first and second inputs 232, 234 toward zero, at which point the drain voltage of proxy driver control transistor 222 will be approximately equal to the proxy voltage at 232, which is programmed through configuration inputs 250 to be representative of or equal to the drain voltage of driver bias control transistor 210. Furthermore, as current mirror input current 254 is effectively equal to (or proportional to) current mirror output 255 and supply current 219, and current 221 is scale factor of current mirror input current 254 (based on the relative scaling of proxy gate coupling transistor 242 and proxy drain coupling transistor 244) the resulting current 221 is a scale current of supply current 219. At which point, the drain voltage of proxy driver control transistor 222 (and thus also the drain voltage of proxy laser drive cell 220) should approximately equal the drain voltage of driver bias control transistor 210 (and thus also the drain voltage of laser drive cell 206), due to any scaling between proxy drive current 221 and driver bias control transistor 210 (discussed above), the laser current 205 will be a scale of proxy drive current 221 and a scale of supply current 219. Accordingly, at equilibrium, the proxy gate control signal 224 is the appropriately derived relative $V_{control}$ signal for the desired laser current 205.

The overall effect is that the laser circuit 200, through proxy laser drive cell 220 generates a proxy gate control signal 224 ($V_{control}$) suitable for driving the laser drive cell 206 at a scaled laser current 205 to proxy drive current 221 (a scaled multiple of supply current 219) at the same drain voltage for proxy driver control transistor 222 and driver bias control transistor 210.

The reverse conditions are also true if less current laser current 205 is desired, in which case, second constant current supply 216 configuration inputs 250 are adjusted to sink less current at second constant current supply input 217 (and supply less current at second constant current supply output 218).

The derived gate voltage, proxy gate control signal 224, is electrically interfaced to the laser drive cell 206 in a way that minimizes the impact of differences between the local laser ground 207 and the proxy ground 225, for example through the use of a voltage to current controller 300 (or V to I controller). One example of a voltage to current controller is shown in FIG. 2, however it should be understood that there are additional configurations that would convert the disclosed voltage signal to a current signal.

Figure 2:
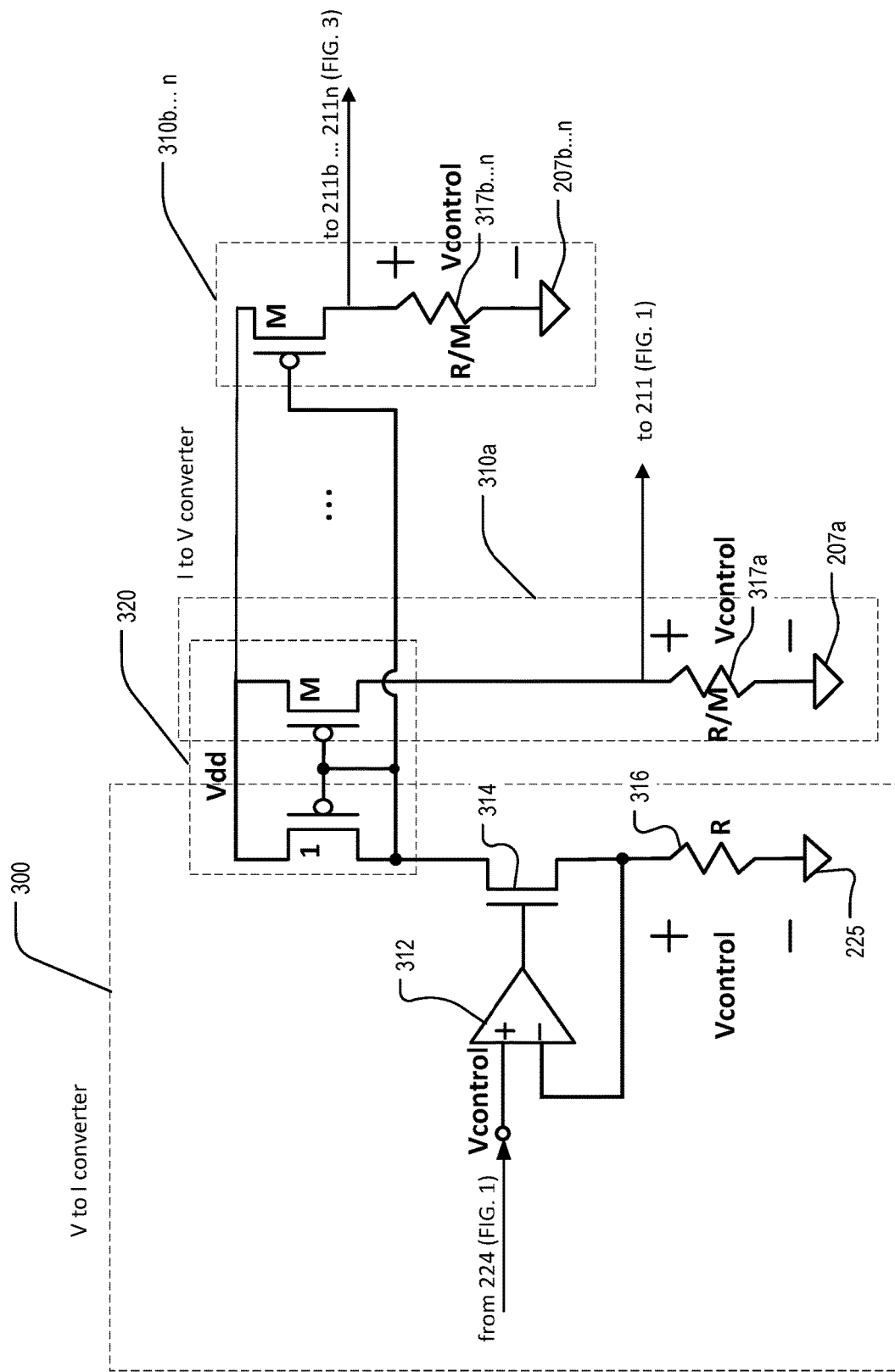
FIG. 2 is an electrical schematic of a voltage to current controller and a current to voltage controller in accordance with disclosed embodiments.

With reference to FIG. 2, the example voltage to current controller 300 utilizes an amplifier 312 as a comparator, for example, an op-amp and a MOSFET 314 to servo a current through resistance 316 until the voltage drop across the resistance 316 is equal to that of proxy gate control signal 224 ($V_{control}$). That current may then, in one example be mirrored through a current mirror 320 for transit and connection to one or more drive cells 206.

In close proximity to one or more drive cells, a current to voltage converter 310a through 310n (n may be any integer), respectively, may be implemented using the same I-R voltage resistance value developed across resistance 317a to convert the current into the driver bias gate control signal 211 with respect to local laser ground 207a (or 207a . . . 207n). It should be noted that if a 1:1 current mirror 320 is utilized (where M in FIG. 2 is equal to 1), then resistance 317a will equal 316. However, other configurations may be used where M is not equal to 1 and the current is scaled. Because the driver bias gate control signal 211 is developed across resistance 317a with respect to local laser ground 207, inaccuracies with respect to ground variations is minimized. In addition, if desired, there can be one current to voltage converter 310a-n for each laser drive cell 206 (a . . . n) (as discussed with reference to FIG. 3) or multiple laser drive cells 206 in close proximity can share one or more current to voltage converters 310. Regardless, the same gate-source voltage may be implemented at one or more drive cells 206 regardless of the local laser ground 207.

Figure 3:
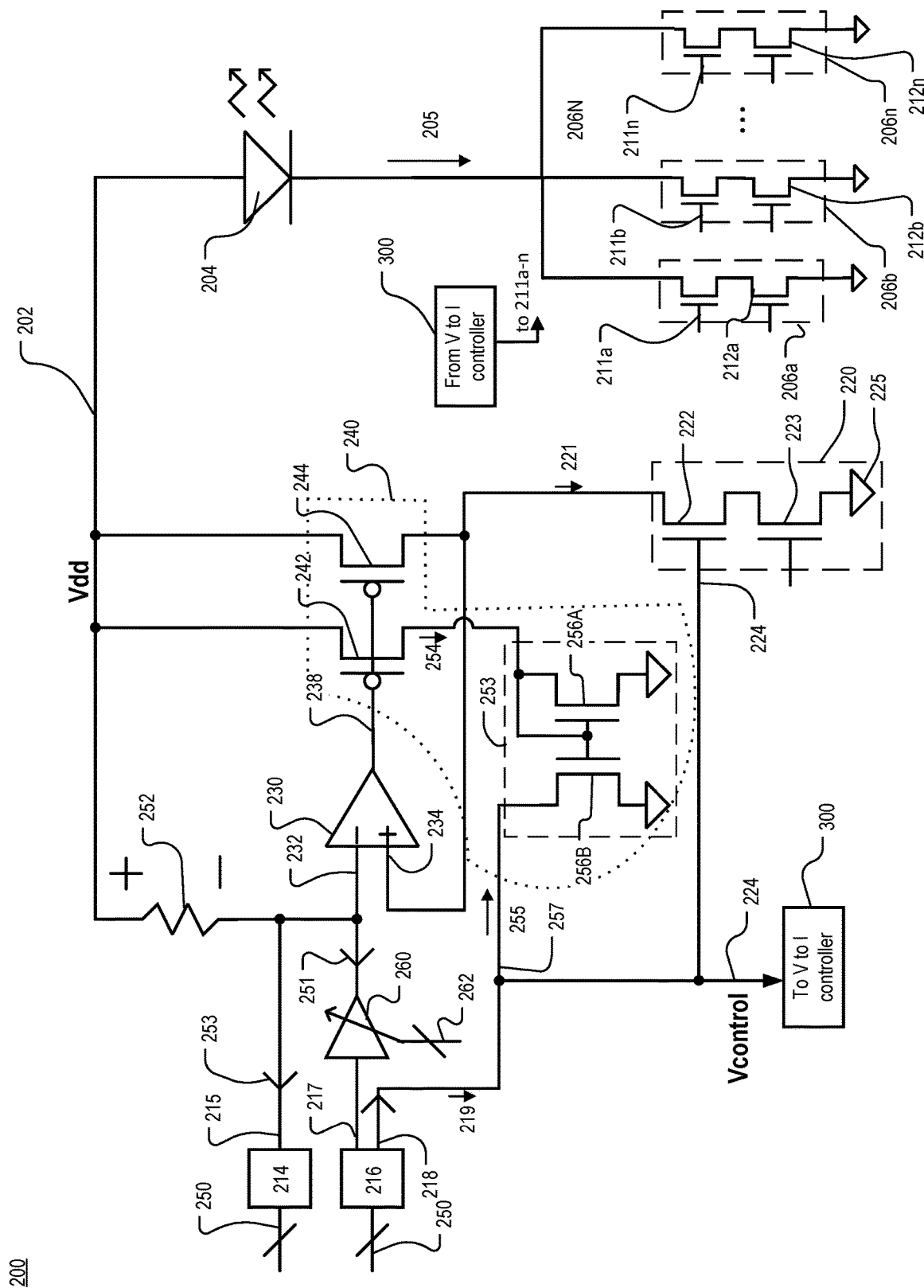
FIG. 3 is an electrical schematic of a laser circuit in accordance with disclosed embodiments.

Optionally, as shown in FIG. 3, laser circuit 200a, where like reference numerals indicate similar components (and certain reference numerals have been omitted for clarity), there are a plurality of laser drive cells 206a, 206b . . . 206n (n can be any integer), where each of the laser drive cells will be referred to collectively as 206N. And thus, the derived proxy gate control signal 224 can be applied as driver bias gate control signals 211N (211a, 211b . . . 211n, respectively) such that each of the laser drive cells 206N can collectively pass the laser 204 drive current 205, for example, in parallel. Or, in another alternative, the driver enable transistors 212N (212a, 212b . . . 212n) may be used to selectively enable one or more laser driver cells 206 to reduce the overall current 205 of the laser 204 when less than the maximum output power is desired. By segmenting the laser drive cells 206N into a plurality of laser drive cells 206a, 206b . . . 206n, certain advantages may be obtained when compared to a monolithic laser drive cell, including, for example simulation accuracy, production test, scalability, and physical design.

As discussed above, laser drive cells 206N may be implemented as a low-side (n-ch) or high-side switch (p-ch) (shown in the FIGS. are low side switches only). High current monolithic laser drivers typically require that the switch, e.g., a driver bias control transistor or a driver enable transistor, FET be large for low RDs or VDSAT (the minimum voltage that is required to keep the transistor in saturation). For currents in the amp range (i.e. >1 A), the dimensions of the FET can be in millimeters and the FETs in any CMOS inverter pre-drivers could have a width of 100 um for example.

As such, simulation accuracy can be improved. Large devices have distributed resistor and capacitor parasitics that cause delays and current crowding even within the device itself. For an implementation with many sub-sections of manageable size this problem is reduced proportionally. Resistance and capacitance simulation determinations between multiple laser drive cell sub-sections can rely on standard IC extraction techniques minimizing the impacts of large resistor and capacitor parasitics associated with larger monolithic devices.

Further, high currents are difficult to manage for quality assurance testing, especially in a wafer sort environment during manufacturing. Wires and probes are long and have resistance and inductance that interfere with proper operation of a high current circuit. A segmented design among multiple laser drive cells can be tested one segment at a time.

A segmented design is also more easily scalable. Future versions or higher current versions of a segmented circuit can be created by increasing the number of segments or laser drive cells. The segment having already been designed and proven will give dependable results. And the segments can be geographically distributed on an integrated circuit as needed. For high currents, there will be many inputs and outputs going to the load (pads, pillars, solder bumps—whatever type of physical interface there may be to the load.). Segments of the driver can be placed near the associated inputs and outputs.

While not shown in the drawings, additional proxy laser drive cells 220 and/or proxy driver control transistors 222 may also be utilized in parallel operation to appropriately scale the relative currents of the proxy drive cells 220.

The above discussion of laser circuit 200 is described such that the driver bias control transistor 210 (and proxy driver control transistor 222) are operated in the saturation region, which can be advantageous because there is smaller current slope versus drain voltage variation to control. However, the transistors can alternatively be operated in the triode region albeit with greater current-drain voltage slopes.

What is claimed as new and desired to be protected by Letters Patent of the United States is:

1. A laser circuit comprising:
   a supply power bus adapted to provide a supply voltage;
   a first constant current supply;
   a second constant current supply;
   at least one laser drive cell in the current path of a laser, the laser drive cell comprising a driver bias control transistor adapted to regulate a laser current through the laser drive cell;
   at least one proxy laser drive cell, the proxy laser drive cell comprising a proxy driver control transistor adapted to regulate a proxy drive current through the proxy laser drive cell;
   a proxy comparator circuit comprising a first input, a second input, and an output, wherein the proxy comparator circuit is adapted to generate the output based on the difference between the first input and the second input, wherein the first and second constant current supplies establish a proxy voltage at the first input of the proxy comparator circuit;
   wherein the output of the proxy comparator circuit is electrically interfaced with the proxy laser drive cell such that the output of the proxy comparator circuit varies a current through the proxy laser drive cell;
   wherein a proxy gate control signal for the proxy laser drive cell is electrically interfaced to the driver bias control transistor.

2. The laser circuit of claim 1, wherein the laser drive cell has a laser drive cell drain voltage, the proxy drive cell has a proxy laser drive cell drain voltage and the comparator circuit is adapted to servo the proxy drive cell drain voltage to match the laser drive cell drain voltage.

3. The laser circuit of claim 1, wherein the laser is a vertical cavity surface emitted laser (VCSEL).

4. The laser circuit of claim 1, wherein the output of the proxy comparator circuit is electrically interfaced with the proxy laser drive cell through a first proxy coupling transistor and a second proxy coupling transistor, wherein a gate of each of the first and second coupling transistors are electrically connected to the output of the proxy comparator circuit.

5. The laser circuit of claim 4, wherein the first proxy coupling transistor has a drain terminal electrically connected to a current mirror and an output of the current mirror is electrically connected to a gate of the proxy driver control transistor to provide the proxy gate control signal.

6. The laser circuit of claim 4, wherein the second proxy coupling transistor has a drain terminal electrically connected to a drain of the proxy driver control transistor and to the second input of the proxy comparator circuit.

7. The laser circuit of claim 1, wherein the proxy gate control signal is electrically interfaced to the driver bias control transistor through a voltage to current controller.

8. The laser circuit of claim 1, wherein the first input of the proxy comparator circuit is adapted to receive a proxy voltage comprising a first voltage component about equal to a laser threshold voltage of the laser and a second voltage component proportional to a current-based voltage drop of the laser, wherein the current-based voltage drop of the laser is a function of a current through laser.

9. The laser circuit of claim 1, wherein the first input of the proxy comparator circuit is electrically interfaced with the first constant current supply, the second constant current supply, and a proxy resistor, wherein the proxy resistor is electrically between the first input of the proxy comparator circuit and the supply power bus and first and second constant current supplies are adapted to each sink a constant current, respectfully, that establishes the proxy voltage at the first input of the proxy comparator circuit.

10. The laser circuit of claim 9, wherein the proxy voltage is indicative of a laser knee voltage of the laser summed with a current-based voltage drop of the laser, wherein the current-based voltage drop of the laser is a function of a current through laser.

11. The laser circuit of claim 1, wherein the first input of the proxy comparator circuit is inverting and the second input of the proxy comparator circuit is non-inverting.

12. The laser circuit of claim 1, wherein the first and second constant current supplies are digitally configurable.

13. The laser circuit of claim 1, wherein the laser drive cell further comprises a driver enable transistor in the current path of the laser and the proxy laser drive cell further comprises a proxy enable transistor in the current path of the proxy driver control transistor.

14. The laser circuit of claim 1, wherein the second constant current supply is adapted to supply a constant current electrically interfaced to an output of a current mirror and a gate of the proxy driver control transistor.

15. The laser circuit of claim 1, wherein the proxy comparator circuit comprises an operational amplifier.

16. The laser circuit of claim 1, further comprising a scaling amplifier electrically between the second constant current supply and the proxy comparator circuit.

17. The laser circuit of claim 1, wherein the laser circuit further comprises a plurality of laser drive cells, each in the current path of the laser.

18. The laser circuit of claim 1, wherein laser circuit further comprises a plurality of proxy laser drive cells.

19. The laser circuit of claim 18, wherein the laser circuit further comprises a plurality of second proxy coupling transistors, and each second proxy coupling transistors is respectively electrically coupled to the proxy driver control transistor within each proxy laser drive cell.

* * * * *